(12) United States Patent
Collins et al.

(10) Patent No.: US 11,997,937 B2
(45) Date of Patent: May 28, 2024

(54) CHALCOGENIDE MEMORY DEVICE COMPOSITIONS

(71) Applicant: Micron Technology, Inc., Boise, ID (US)

(72) Inventors: Dale W. Collins, Boise, ID (US); Paolo Fantini, Vimercate (IT); Lorenzo Fratin, Buccinasco (IT); Enrico Varesi, Milan (IT)

(73) Assignee: Micron Technology, Inc., Boise, ID (US)

( * ) Notice: Subject to any disclaimer, the term of this patent is extended or adjusted under 35 U.S.C. 154(b) by 141 days.

(21) Appl. No.: 17/676,708

(22) Filed: Feb. 21, 2022

(65) Prior Publication Data

US 2023/0270025 A1    Aug. 24, 2023

(51) Int. Cl.
*H10N 70/00* (2023.01)
*C01B 17/02* (2006.01)
*C01B 19/04* (2006.01)
*H10B 63/00* (2023.01)
*H10B 63/10* (2023.01)

(52) U.S. Cl.
CPC ..... *H10N 70/8822* (2023.02); *C01B 17/0243* (2013.01); *C01B 19/04* (2013.01); *H10B 63/10* (2023.02); *H10B 63/80* (2023.02)

(58) Field of Classification Search
CPC .. H10N 70/8822; H10N 70/026; H10N 70/20; H10N 70/231; H10N 70/245; H10N 70/826; H10N 70/882; H10N 70/8825; H10N 70/8828; C01B 17/0243; C01B 19/04; H10B 63/10; H10B 63/80; H10B 63/20; H10B 63/24; H10B 63/84
See application file for complete search history.

(56) References Cited

U.S. PATENT DOCUMENTS 7,402,851 B2 *  7/2008  Hideki ............... H10N 70/026
                                                       257/248
2022/0123209 A1 *  4/2022  Cheng .................... H10B 63/84

OTHER PUBLICATIONS

Semyon D. Savransky, "Polyamorphous Chalcogenides (PAC) for DRAM and fast NVM: Concept and Initial Experimental Results" MRS 2011 (21 pages).
Semyon D. Savransky, "Polyamorphous Compounds for New Fast Non-volatile Memory: Concept and Initial Experimental Results", 2011 MRS Meeting & Exibit, <https://mrs.org/spring2011/program-sessions/?code=R. (6 pages).

* cited by examiner

*Primary Examiner* — Allison Bernstein
(74) *Attorney, Agent, or Firm* — Holland & Hart LLP

(57) ABSTRACT

Methods, systems, and devices for chalcogenide memory device compositions are described. A memory cell may use a chalcogenide material having a composition as described herein as a storage materials, a selector materials, or as a self-selecting storage material. A chalcogenide material as described herein may include a sulfurous component, which may be completely sulfur (S) or may be a combination of sulfur and one or more other elements, such as selenium (Se). In addition to the sulfurous component, the chalcogenide material may further include one or more other elements, such as germanium (Ge), at least one Group-III element, or arsenic (As).

25 Claims, 5 Drawing Sheets

CHALCOGENIDE MEMORY DEVICE COMPOSITIONS

FIELD OF TECHNOLOGY

The following relates to one or more systems for memory, including chalcogenide memory device compositions.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access information stored by a memory device, a component may read (e.g., sense, detect, retrieve, identify, determine, evaluate) the state of one or more memory cells within the memory device. To store information, a component may write (e.g., program, set, assign) one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be described in terms of volatile configurations or non-volatile configurations. Volatile memory cells (e.g., DRAM) may lose their programmed states over time unless they are periodically refreshed by an external power source. Non-volatile memory cells (e.g., NAND) may maintain their programmed states for extended periods of time even in the absence of an external power source.

DETAILED DESCRIPTION

Figure 1:
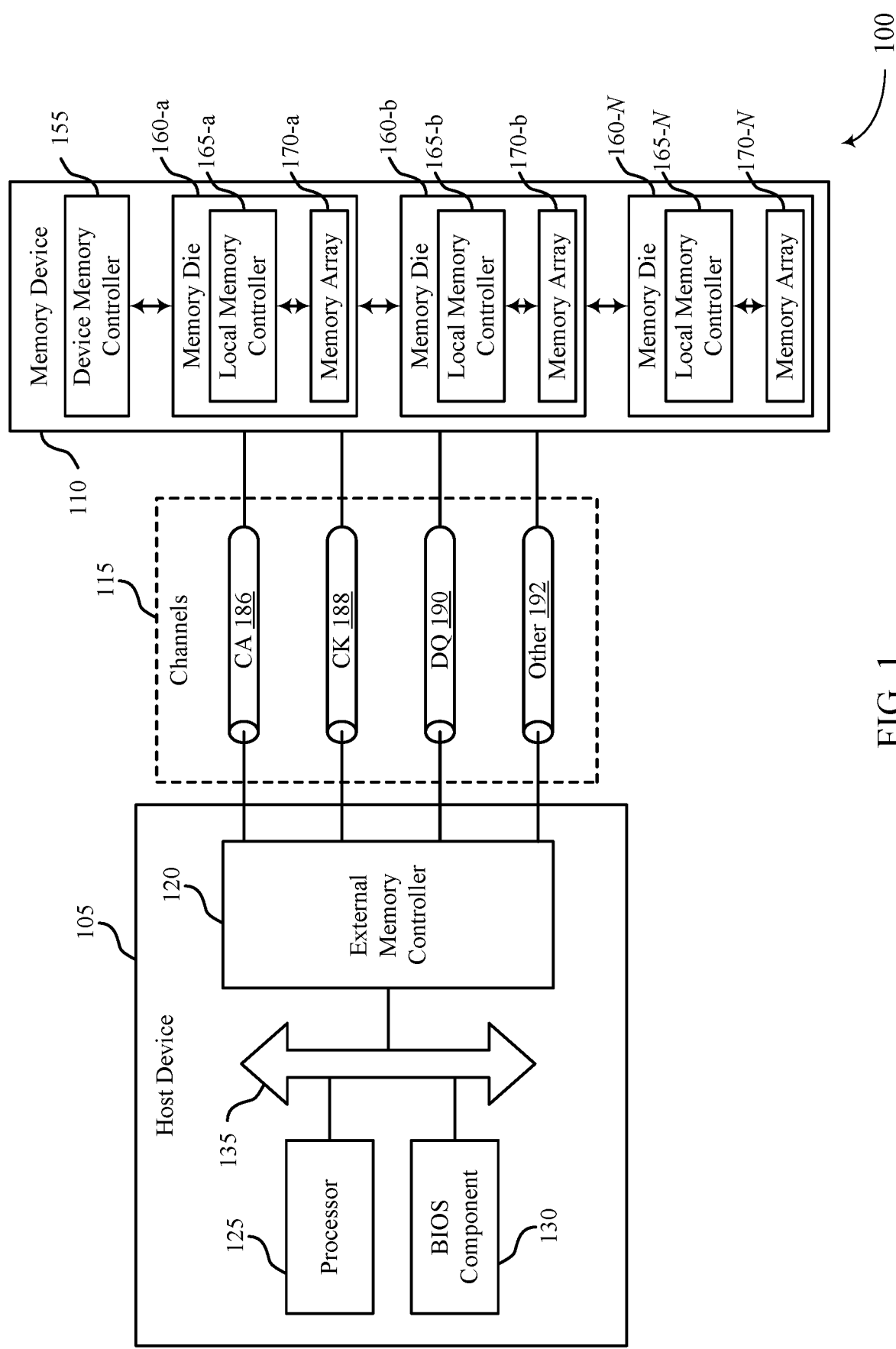
FIG. 1 illustrates an example of a system that supports chalcogenide memory device compositions in accordance with examples as disclosed herein.

Some memory devices may include memory cells that include at least one element that comprises a chalcogenide material (e.g., chalcogenide composition, chalcogenide glass, chalcogenide alloy). For example, a memory cell may include a storage element (e.g., a component operable to store one or more logic values), a selector element (e.g., a component operable to selectively allow access to a memory cell when targeted for reading, writing, or performing some other operation while preventing disturb of the memory cell when one or more other memory cells are targeted), or a self-selecting storage element (e.g., a single component operable to provide both storage and selection functionalities).

In some cases, a chalcogenide material included in a memory cell may include selenium (Se), arsenic (As), and germanium (Ge), which may be referred to as a SAG composition. In some cases, a chalcogenide material included in a memory cell may further include a Group III element—such as boron (B), aluminum (Al), gallium, (Ga), indium (In), or thallium (Tl)—which may increase a threshold voltage window of the memory cell (e.g., a difference between threshold voltages corresponding different logic states of the memory cell, which may alternatively be referred to, for example, as a read window, read budget, or read budget window). A Group III element may alternative be referred to as a Group 13 (or column 13) element. In some cases, a SAG composition which includes a Group III element may be referred to as a III-SAG composition. However, including a Group III element may also increase current leakage of the memory cell, which may in turn increase the power consumed by the memory cell during access operations, such as a programming operation.

Additionally, a memory cell (or element therein) that has a SAG or III-SAG composition may have a relatively large thickness (e.g., relative to other potential approaches). The thickness of a memory cell may correspond to a length of the memory cell in the direction of current flow. For example, the thickness of a memory cell may correspond to the distance between the electrodes to which a bias voltage is applied during access operations for the memory cell (e.g., the distance between access lines or electrodes in contact with the access lines and the memory cell). In some cases, a memory cell with a relatively large thickness may have a reduced mechanical stability, may reduce the memory density of a memory array using the memory cell (e.g., due to the larger size of the memory cell), or both. Accordingly, compositions which consume less power (e.g., less power than SAG or III-SAG compositions), allow for a reduced memory cell thickness, increase read window, or any combination thereof, may be desired.

A chalcogenide, material as described herein may include sulfur (S)—e.g., relative to a SAG or III-SAG composition, some or all of the Se of the SAG or III-SAG composition may be replaced with sulfur. That is, a chalcogenide composition as described herein may include a sulfurous component (which may alternatively be referred to as a component comprising sulfur). In some cases, ad SAG or III-SAG composition that includes a sulfurous component may be referred to as a SAGS or III-SAGS composition, respectively. In some examples, the introduction of sulfur into a chalcogenide material may improve various chemical and electrical properties of the composition (e.g., compared to a SAG or III-SAG composition). For example, sulfur may bond more strongly with other components of the composition (e.g., the bonding energy between sulfur and arsenic may be greater than the bonding energy between selenium and arsenic), which may increase a band gap energy for the composition. Accordingly, the conductivity for the chalcogenide composition may be increased, which may in turn decrease the leakage current.

A chalcogenide material as described herein may be used, for example, as a component or element (e.g., as a storage element, a selection element, or a self-selecting storage element) of a phase change memory (PCM) memory cell or polarity-based memory cell, for example. Chalcogenide compositions may have a threshold voltage at which they become conductive (i.e. they switch on to allow current flow). The threshold voltage may change over time, which may be referred to as drift. Compositions that have a higher tendency for voltage drift may limit the usefulness and performance of devices employing those compositions. Chalcogenide material compositions may also have a memory window that corresponds to a difference in threshold voltage of the chalcogenide material composition when in one state (e.g., when programmed using a voltage having a positive polarity) versus when in another state (e.g., when programmed using a voltage having a negative polarity). Compositions that have a smaller memory window may limit the performance of devices employing those compositions. In some cases, due to the reduced leakage, a memory cell using a chalcogenide material as described herein may support a reduced memory cell thickness (e.g., the reduction in leakage current may compensate from an increase in leakage caused by a reduced memory cell thickness). Further, relative to a SAGS or III-SAGS composition for example, substituting at least some of the selenium with sulfur may decrease a change in threshold voltage for a memory cell over time (e.g., may decrease a drift rate). Thus, a memory cell which includes a chalcogenide material as described herein may allow for a reduced memory cell thickness, reduced leakage current reduced power consumption, reduced drift rate, or any combination thereof.

Features of the disclosure are initially described in the context of memory systems, dies, and arrays as described with reference to FIGS. 1-3. Features of the disclosure are described in the context of a memory array and plots of characteristics of chalcogenide material as described with reference to FIGS. 4-5B.

FIG. 1 illustrates an example of a system 100 that uses chalcogenide memory device compositions in accordance with examples as disclosed herein. The system 100 may include a host device 105, a memory device 110, and a plurality of channels 115 coupling the host device 105 with the memory device 110. The system 100 may include one or more memory devices, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices 105. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a secondary-type or dependent-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 (e.g., memory die 160-$a$, memory die 160-$b$, memory die 160-N) may include a local memory controller 165 (e.g., local memory controller 165-$a$, local memory controller 165-$b$, local memory controller 165-N) and a memory array 170

(e.g., memory array 170-*a*, memory array 170-*b*, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies 160 may be referred to as a multi-die memory or a multi-die package or a multi-chip memory or a multi-chip package.

The memory die 160 may be an example of a two-dimensional (2D) array of memory cells or may be an example of a three-dimensional (3D) array of memory cells. A 2D memory die 160 may include a single memory array 170. A 3D memory die 160 may include two or more memory arrays 170, which may be stacked on top of one another or positioned next to one another (e.g., relative to a substrate). In some examples, memory arrays 170 in a 3D memory die 160 may be referred to as decks, levels, layers, or dies. A 3D memory die 160 may include any quantity of stacked memory arrays 170 (e.g., two high, three high, four high, five high, six high, seven high, eight high). In some 3D memory dies 160, different decks may share at least one common access line such that some decks may share one or more of a row line or column line.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of the system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some cases, a memory array 170 may include a memory cell, and the memory cell may include one or more elements having a chalcogenide composition as described herein. For example, the memory cell may use the chalcogenide composition as a storage element, a selection element, or a self-selecting storage element). In some cases, a memory cell which includes a chalcogenide material as described herein may have a reduced leakage current, may support a reduced thickness of the memory cell, or both (e.g., compared with a memory cell which does not include sulfurous component or other aspects of a chalcogenide material as described herein). Further, the memory cell may have an increased threshold voltage window, a reduced drift rate, or both (e.g., compared with a memory cell which does not include sulfurous component or other aspects of a chalcogenide material as described herein). Accordingly, a memory device 110 which includes memory cells that incorporate a chalcogenide material as described herein may support a reduced power consumption, an increased threshold voltage window, a reduced drift rate, or a combination thereof.

Figure 2:
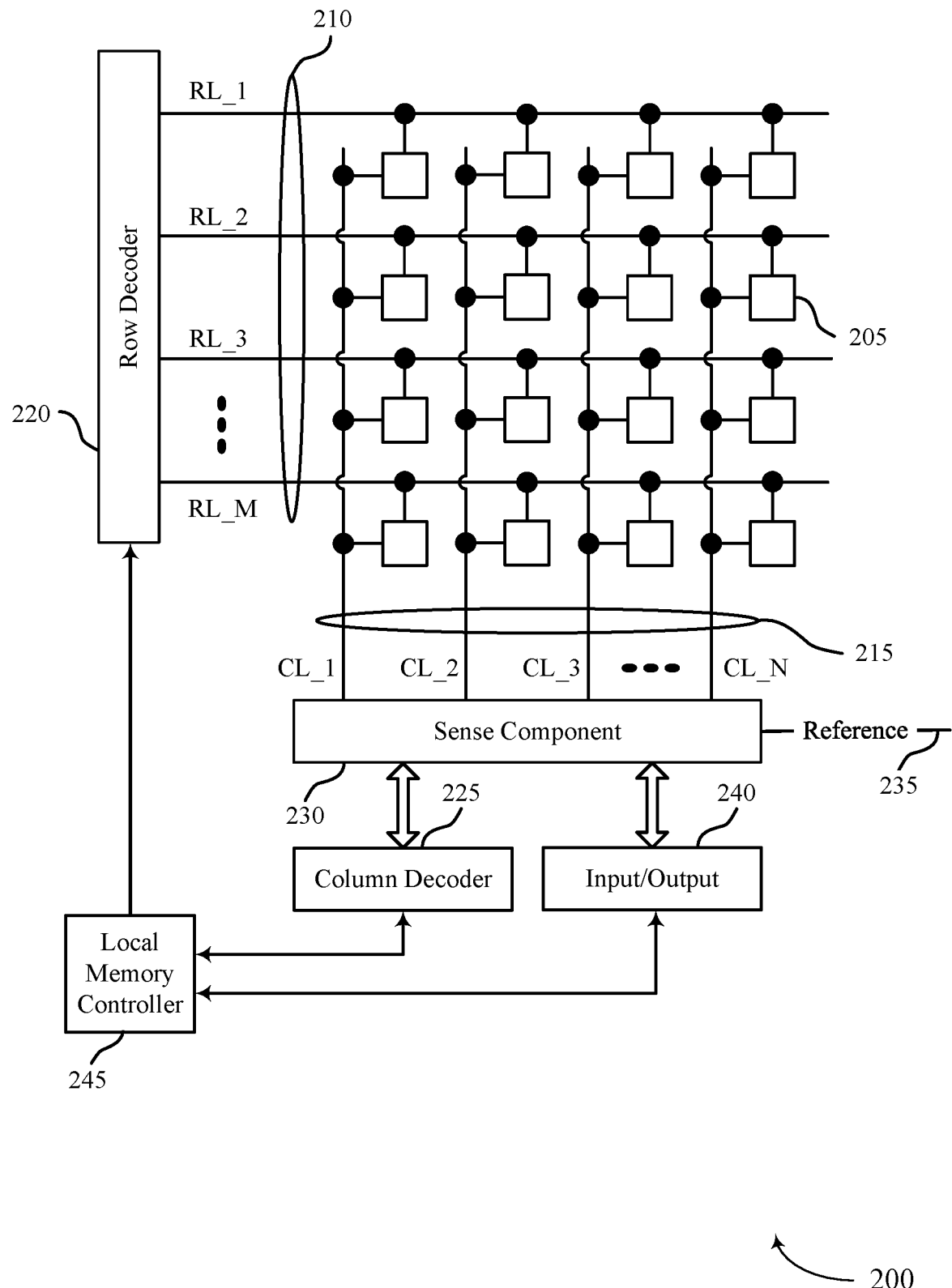
FIG. 2 illustrates an example of a memory die that supports chalcogenide memory device compositions in accordance with examples as disclosed herein.

FIG. 2 illustrates an example of a memory die 200 that uses chalcogenide memory device compositions in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., a programmed one of a set of two or more possible states). For example, a memory cell 205 may be operable to store one bit of information at a time (e.g., a logic 0 or a logic 1). In some examples, a memory cell 205 (e.g., a multi-level memory cell 205) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a logic state using a configurable material, which may be referred to as a memory element, a memory storage element, a material element, a material memory element, a material portion, or a polarity-written material portion, among others. A configurable material of a memory cell 205 may be a chalcogenide material (composition) as described herein (e.g., with reference to FIGS. 5A and 5B). For example, a chalcogenide storage element may be used in a phase change memory (PCM) cell, a thresholding memory cell, or a self-selecting memory cell, as described in greater detail elsewhere herein.

The memory die 200 may include the access lines (e.g., row lines 210 and the column lines 215) arranged in a pattern, such as a grid-like pattern. Access lines may be formed of one or more conductive materials. In some examples, row lines 210 may be referred to as word lines. In some examples, column lines 215 may be referred to as digit lines or bit lines. References to access lines, row lines, column lines, word lines, digit lines, or bit lines, or their analogues, are interchangeable without loss of understanding or operation. Memory cells 205 may be positioned at intersections of the row lines 210 and the column lines 215.

Operations such as reading and writing may be performed on the memory cells 205 by activating or selecting access lines such as one or more of a row line 210 or a column line 215. By biasing a row line 210 and a column line 215 (e.g., applying a voltage to the row line 210 or the column line 215), a single memory cell 205 may be accessed at their intersection. The intersection of a row line 210 and a column line 215 in either a two-dimensional or three-dimensional configuration may be referred to as an address of a memory cell 205. An access line may be a conductive line coupled with a memory cell 205 and may be used to perform access operations on the memory cell 205.

Accessing the memory cells 205 may be controlled through a row decoder 220 or a column decoder 225. For example, a row decoder 220 may receive a row address from the local memory controller 245 and activate a row line 210 based on the received row address. A column decoder 225 may receive a column address from the local memory controller 245 and may activate a column line 215 based on the received column address.

The sense component 230 may be operable to detect a state (e.g., a material state, a resistance, a threshold state) of a memory cell 205 and determine a logic state of the memory cell 205 based on the stored state. The sense component 230 may include one or more sense amplifiers to amplify or otherwise convert a signal resulting from accessing the memory cell 205. The sense component 230 may compare a signal detected from the memory cell 205 to a reference 235 (e.g., a reference voltage). The detected logic state of the memory cell 205 may be provided as an output of the sense component 230 (e.g., to an input/output 240), and may indicate the detected logic state to another component of a memory device that includes the memory die 200.

The local memory controller 245 may control the accessing of memory cells 205 through the various components (e.g., row decoder 220, column decoder 225, sense component 230). The local memory controller 245 may be an example of the local memory controller 165 described with reference to FIG. 1. In some examples, one or more of the row decoder 220, column decoder 225, and sense component 230 may be co-located with the local memory controller 245. The local memory controller 245 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 245 may generate row signals and column address signals to activate the target row line 210 and the target column line 215. The local memory controller 245 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 245 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 245 in response to various access commands (e.g., from a host device 105). The local memory controller 245 may be operable to perform other access operations not listed here or other operations related to the operating of the memory die 200 that are not directly related to accessing the memory cells 205.

In some cases, a memory die 200 may include a memory cell 205 that comprises at least one element having a chalcogenide composition as described herein (e.g., a SAGS or III-SAGS composition). For example, within the memory cell 205, the chalcogenide composition may be or be included in a selection element, a storage element, or a self-selecting storage element. In some cases, a memory cell 205 which includes an element having a chalcogenide composition as described herein may have a reduced leakage current (e.g., compared with a memory cell which does not include a chalcogenide composition as described herein), may support a reduced thickness of the memory cell 205, or both. Further, the memory cell 205 may have an increased threshold voltage window, a reduced drift rate, or both. Accordingly, the memory die 200 may support a reduced power consumption, an increased threshold voltage window, a reduced drift rate, or a combination thereof.

Figure 3:
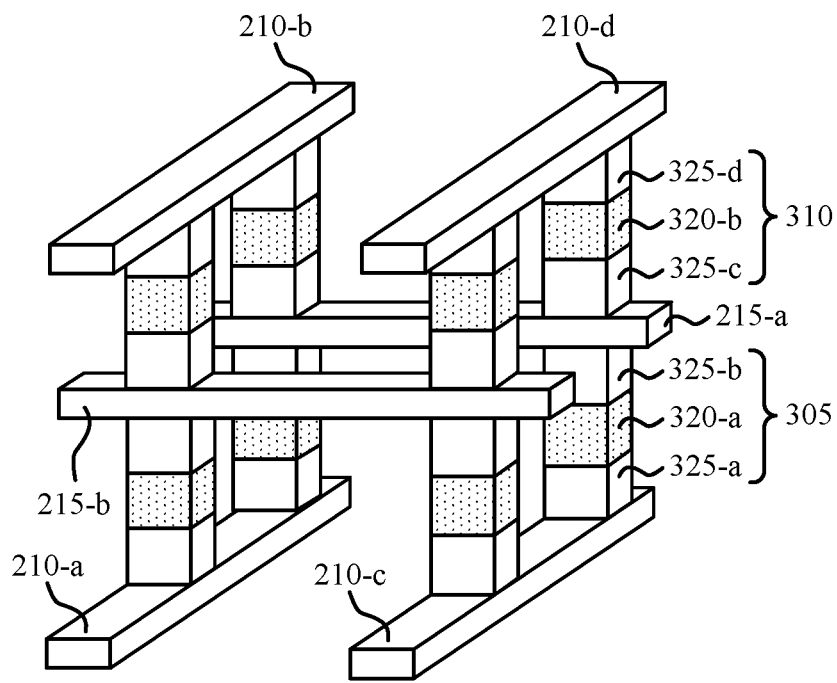
FIG. 3 illustrates an example of memory cells that support chalcogenide memory device compositions in accordance with examples as disclosed herein.

FIG. 3 illustrates an example of a memory array 300 in accordance with examples as disclosed herein. Memory array 300 may be an example of portions of the memory arrays or memory dies described with reference to FIGS. 1 and 2. The memory array 300 may include a first deck 305 of memory cells that is positioned above a substrate (not shown) and a second deck 310 of memory cells on top of the first array or deck 305. Though the example of memory array 300 includes two decks 305, 310, the memory array 300 may include any quantity of decks (e.g., one or more than two).

Memory array 300 may also include a row line 210-a, a row line 210-b, a row line 210-c, a row line 210-d, a column line 215-a, and a column line 215-b, which may be examples of row lines 210 and column lines 215, as described with reference to FIG. 2. One or more memory cells of the first deck 305 and the second deck 310 may include one or more chalcogenide materials in a pillar between access lines. For example, a single stack between access lines may include one or more of a first electrode, a first chalcogenide material (e.g., selector component), a second electrode, a second chalcogenide material (e.g., storage element), or a third electrode. Although some elements included in FIG. 3 are labeled with a numeric indicator, other corresponding elements are not labeled, although they are the same or would be understood to be similar, in an effort to increase visibility and clarity of the depicted features.

One or more memory cells of the first deck 305 may include one or more of an electrode 325-a, a storage element 320-a, or an electrode 325-b. One or more memory cells of the second deck 310 may include an electrode 325-c, a storage element 320-b, and an electrode 325-d. The storage elements 320 may be or include a chalcogenide material as described herein. The storage elements 320 may be a phase change storage element, a thresholding storage element, or a self-selecting storage element. The memory cells of the first deck 305 and second deck 310 may, in some examples, have common conductive lines such that corresponding memory cells of one or more decks 305 and one or more decks 310 may share column lines 215 or row lines 210. For example, the first electrode 325-c of the second deck 310 and the second electrode 325-b of the first deck 305 may be coupled with column line 215-a such that the column line 215-a may be shared by vertically adjacent memory cells.

In some examples, the storage element 320 may be an example of a phase change element within a phase change memory cell. In such examples, the chalcogenide material of the storage element 320 may be operated so as to undergo a phase change or change to different physical state during normal operation of the memory cell. For example, a phase change memory cell may have an amorphous state (e.g., a relatively disordered atomic configuration) and a crystalline state (e.g., a relatively ordered atomic configuration). Phase change memory cells may exhibit an observable difference between resistances of a crystalline state and an amorphous state in phase change materials, which may be chalcogenide materials. A material in the crystalline state may have atoms arranged in a periodic structure, which may result in a relatively low electrical resistance. By contrast, a material in an amorphous state may have no or relatively little periodic atomic structure, which may have a relatively high electrical resistance. The difference in resistance values between amorphous and crystalline states of a material may be substantial. For example, a material in an amorphous state may have a resistance one or more orders of magnitude greater than the resistance of the material in its crystalline state. In some examples, the material may be partially amorphous and partially crystalline, and the resistance may be of some value between the resistances of the material in a wholly crystalline or wholly amorphous state. In such examples, a material may be used to store more than two logic states (e.g., three or more logic states).

In some examples, the storage element 320 may be an example of a thresholding (e.g., polarity-based, polarity-programmed) element within a thresholding memory cell. For a thresholding memory cell, some or all of the set of logic states supported by the memory cell may be associated with an amorphous state of the chalcogenide material (e.g., the material in a single state may be operable to store different logic states). In some examples of thresholding memory cells, the storage element 320 may be an example of a self-selecting storage element.

During a programming (write) operation of a phase change memory cell (e.g., electrode 325-a, storage element 320-a, electrode 325-b), the various parameters of the programming pulse may influence (e.g., determine, set, program) a particular behavior or characteristic of the material of the storage element 320, such as the threshold voltage of the material or the resistance of the material. To program a low-resistance state (e.g., a relatively crystalline state) in the phase change memory cell, a programming pulse may be applied that heats or melts the material of the storage element 320, which may be associated with forming, at least temporarily, a relatively disordered (e.g., amorphous) atomic arrangement. The amplitude of the programming pulse may be reduced (e.g., relatively slowly) over a duration to allow the material to form crystalline structures as it cools, thereby forming a stable crystalline material state. To program a high-resistance state (e.g., a relatively amorphous state) in the phase change memory cell, a programming pulse may be applied that heats and/or melts the material of the storage element 320. The amplitude of the programming pulse may be reduced more quickly than the programming pulse for the low-resistance state. In such scenarios, the material may cool with atoms in a more disordered atomic arrangement because the atoms were not able to form crystalline structures before the material reached a stable state, thereby forming a stable amorphous material state. The difference in threshold voltages or resistances of the material of the storage element 320 depending on the logic state stored by the material of the storage element 320 may correspond to the read window of the storage element 320. In some cases, a portion of a storage element may undergo a material change associated with the logic states.

During a programming (write) operation of a thresholding memory cell (e.g., including electrode 325-a, storage element 320-a, and electrode 325-b), a polarity of a voltage applied as part of a write operation (e.g., a polarity of a write voltage) relative to a polarity of a voltage applied as part of a read operation (e.g., a polarity of a read voltage) may influence (determine, set, program) a particular behavior or characteristic of the material of the storage element 320, such as the threshold voltage of the material as observed based on the voltage applied as part of the read operation. For example, a thresholding memory cell may exhibit a low threshold voltage when read using a read voltage having the same polarity as a most recently applied write voltage, and the memory cell may exhibit a low threshold voltage when read using a read voltage having a different polarity than a most recently applied write voltage. The difference in threshold voltages of the material of the storage element 320 depending on the logic state stored by the material of the storage element 320 (e.g., the difference between the threshold voltage when the material is storing a logic state '0', which may be associated with a write voltage of a first polarity, versus a logic state '1', which may be associated with a write voltage of a second polarity) may correspond to the read window of the storage element 320.

The architecture of memory array 300 may be referred to as a cross-point architecture, in some examples, in which a memory cell is formed at a topological cross-point between a row line 210 and a column line 215. Such a cross-point architecture may offer relatively high-density data storage with lower production costs compared to other memory architectures. For example, the cross-point architecture may have memory cells with a reduced area and, resultantly, an increased memory cell density compared to other architectures. For example, the architecture may have a 4F2 memory cell area, where F is the smallest feature size, compared to other architectures with a 6F2 memory cell area, such as those with a three-terminal selector element. For example, DRAM may use a transistor, which is a three-terminal device, as the selector element for each memory cell and may have a larger memory cell area compared to the cross-point architecture.

While the example of FIG. 3 shows two memory decks, other configurations are possible. In some examples, a single memory deck of memory cells may be constructed above a substrate, which may be referred to as a two-dimensional memory. In some examples, two or more decks of memory cells may be configured in a similar manner in a three-dimensional cross point architecture. Further, in some cases, elements shown in or described with reference to FIG. 3 may be electrically coupled with one another as shown or described but rearranged physically (e.g., a storage element 320 and possibly a selection element or electrode 325 may be electrically in series between a row line 210 and a column line 215 but need not be in a pillar or stack configuration).

In some cases, a storage element 320 may be or include a chalcogenide material (e.g., a chalcogenide composition) as described herein. The storage element 320 may be a self-selecting storage element. Additionally or alternatively, a memory cell may use a chalcogenide material as described herein as or as part of a selection element (not shown), which may be located between the storage element 320 and the row line 210 for the memory cell or between the storage element and the column line 215 for the memory cell. In some cases, a memory cell 205 that includes a storage element 320 having a chalcogenide composition as described herein may have a reduced leakage current (e.g., compared with a memory cell which does not include such an element), may support a reduced thickness of the memory cell (e.g., a reduced thickness of the storage element 320), or both. Further, such a memory cell may have an increased threshold voltage window, a reduced drift rate, or both. Accordingly, the memory array 300 may support a reduced power consumption, an increased threshold voltage window, a reduced drift rate, or a combination thereof.

Figure 4:
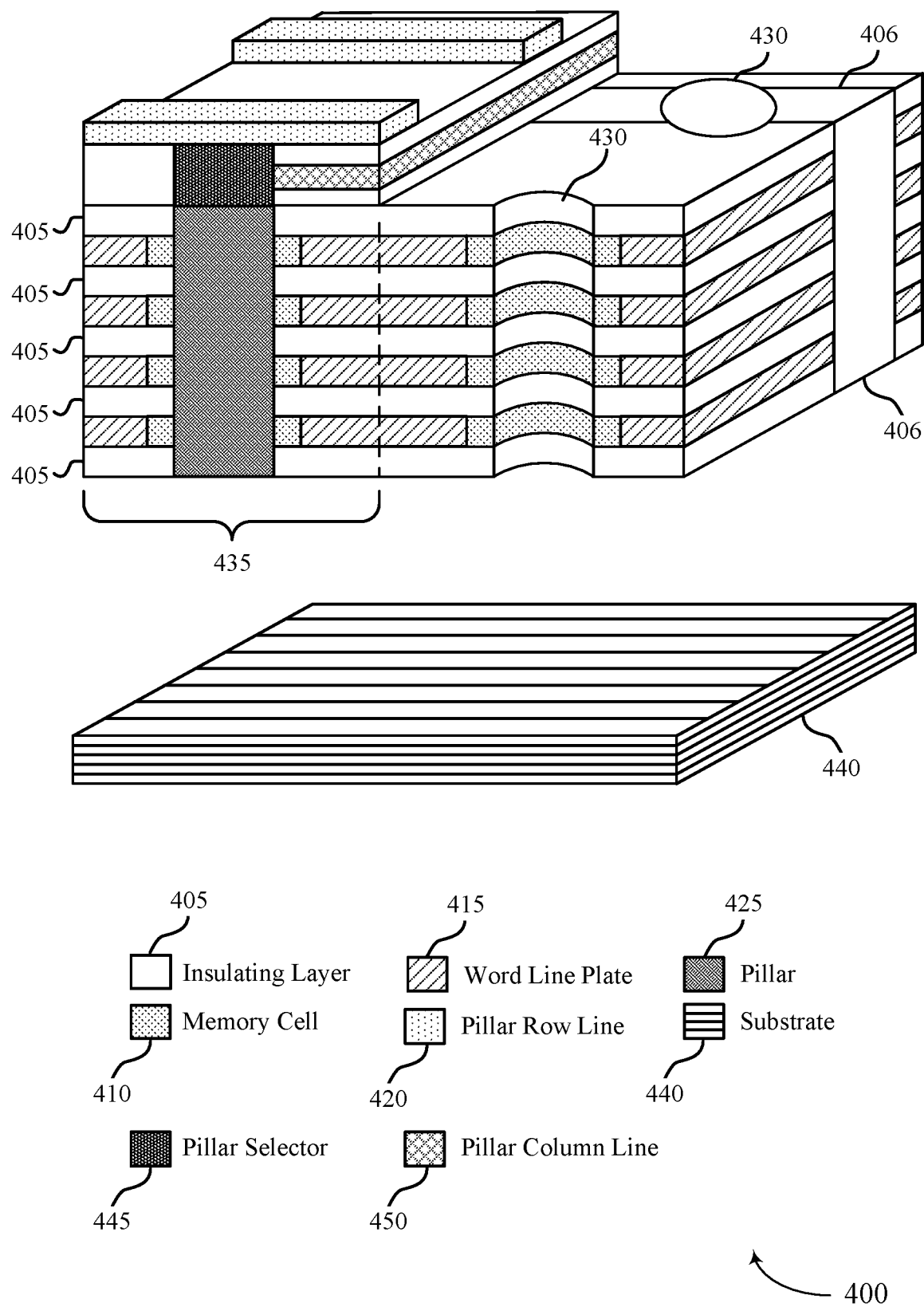
FIG. 4 illustrates an example of a memory array that supports chalcogenide memory device compositions in accordance with examples as disclosed herein.

FIG. 4 illustrates an example of a memory array 400 in accordance with examples as disclosed herein. Memory array 400 may be an example of memory arrays described with reference to FIGS. 1 and 2. Memory array 400 may include multiple levels of memory cells 410 stacked in a vertical direction, relative to a substrate, to create memory cell stacks 435, which may be examples of a memory cell and memory cell stack as described with reference to FIGS. 1 and 2. Memory array 400 may thus be referred to, in some examples, as a 3D memory array. Memory array 400 may include word line plates 415 and pillars 425, which may be examples of word lines and bit lines (e.g., row lines 210 and column lines 215) as described with reference to FIG. 2.

A word line plate 415 may include multiple word lines in a "comb" structure (e.g., a structure that may look like a tool with fingers and a space between each pair of adjoining fingers). The word line plate 415 may, for example, include a sheet of conductive material that includes a first portion extending in a first direction within a plane, and multiple fingers extending in a second direction within the plane. Each finger of the word line plate 415 may represent a word line as described herein. A quantity of fingers (e.g., word lines) and a length of the fingers may define a size of a word line plate 415, where the size of the word line plate may be based on a capacitance of the word line plate 415 in relation to one or more storage class memory (SCM) specifications. Various exemplary details of the comb structure, fingers, and other aspects of a word line plate 415 may be further illustrated elsewhere herein.

Each pillar 425 may each be selectively couplable with a respective pillar row line 420 via a pillar selector 445 (e.g., a transistor or a switching component). For example, a pillar column line 450 for a pillar 425 may be coupled with the pillar selector 445 for the pillar 425, and based on the voltage of the pillar column line 450 (e.g., a voltage differential between the voltage of the pillar column line 450 and the voltage of the pillar row line 420), the pillar selector 445 may be selectively activated or deactivated. When activated (e.g., on, closed, conducting), the pillar selector 445 for a pillar 425 may couple the pillar 425 with the pillar row line 420 for the pillar 425, and thus the voltage of the pillar 425 may become equal or approximately equal to the voltage of the pillar row line 420. In some cases, a pillar selector 445 may be a transistor (e.g., a thin-film transistor (TFT) or other type of transistor), and a gate of the transistor may be couple with the pillar column line 450, a source of the transistor may be coupled with the pillar row line 420, and a drain of the transistor may be coupled with the pillar 425. Hence, in some cases, a pillar column line 450 may alternatively be referred to as a pillar gate line, and a pillar row line 420 may alternatively be referred to as a pillar source line. A pillar decoder as described herein may be operable to selectively activate (e.g., apply a selection voltage) or deactivate (e.g., apply a deselection voltage) to a pillar column line 450 out of a set of pillar column lines 450 associated with the pillar decoder, or to selectively activate (e.g., apply a selection voltage) or deactivate (e.g., apply a deselection voltage) to a pillar row line 420 out of a set of pillar row lines 420 associated with the pillar decoder.

Pillar column lines 450 and pillar row lines 420 may span and thus be coupled with the pillar selectors 445 corresponding rows or columns of pillars 425 within a single word line plate, single word line tile, multiple word line plates, or multiple word line tiles as described herein. One of ordinary skill in the art will appreciate that what direction (e.g., the X or Y direction) is considered a row versus a column may be arbitrary. In some cases, a pillar 425 may correspond (e.g., in terms of one or more functionalities) to a column line 215 as described with reference to FIG. 2. Similarly, pillar decoders, pillar column lines 450, pillar row lines 420, and pillar selectors 445 may correspond (e.g., in terms of one or more functionalities) to a column decoder 225 as described with reference to FIG. 2.

In some cases, pillars 425 coupled with the same pillar column line 450 may be considered as a comb structure with vertical comb fingers (e.g., the pillars 425) that are selectable (e.g. individually relative to other pillars 425 coupled with the same pillar column line 450) via respective pillar row lines 420, and each memory cell 410 may be located at the intersection of a horizontal finger of a word line plate 415 (e.g., a word line) and a vertical finger (e.g., a pillar 425, which may be considered a digit line or a portion of a digit line), though the teachings herein are not limited to such conceptualizations.

Memory array 400 may also include insulating layers 405, trench insulating layers 406, vias 430, and substrate 440. While the example of FIG. 4 illustrates pillar row lines 420 and pillar column lines 450 as above the pillars 425, pillar row lines 420 and pillar column lines 450 may alternatively be below the pillars 425 (e.g., between the pillars 425 and the substrate 440) in some implementations.

Insulating layers 405 may be electrically insulating and may provide insulation between alternating word line plates 415. As described herein, various logic states may be stored by programming the electrical resistance of memory cells 410 (e.g., programming the electrical resistance of a chalcogenide material as described herein, which may be included in the memory cells 410). In some cases, programming the electrical resistance includes passing a current through memory cell 410, heating memory cell 410, melting the material of memory cell 410 (e.g., wholly or partially), applying a voltage of a particular polarity to the memory cell, or any combination thereof—e.g., memory cells may be operated as thresholding memory cells (such as polarity-programmed memory cells) or phase change memory cells. Insulating layers 405 may be composed of multiple sublayers, creating one or more interfaces between memory cells 410.

Memory array 400 may include an array of memory cell stacks 435, and each memory cell stack 435 may include multiple memory cells 410. Memory array 400 may be made by forming a stack of conductive layers, such as word line plates 415, where each conductive layer may be separated from an adjacent conductive layer by one or more electrically insulating layers 405. The electrically insulating layers may include oxide or nitride materials, such as silicon oxide, silicon nitride, or other electrically insulating materials. In some cases, electrically insulating layers 405 may include one or more sublayers. The layers of memory array 400 may be formed on a substrate 440, such as a silicon wafer, or any other semiconductor or oxide substrate. Vias 430 (e.g., openings) may be formed by removing material from the stack of layers through etching or mechanical techniques, or both.

Memory cell 410 (e.g., memory elements, which may be storage elements or self-selecting storage elements) may in some cases be formed by removing material from the conductive layer to create a recess adjacent to a via 430, and forming a variable resistance material in the recess. The variable resistance material may be a chalcogenide material as described herein. For example, material may be removed from the conductive layer by etching, and the variable resistance material may be deposited in the resulting recess to form a memory cell 410 (e.g., memory element, which may be a storage element). Each via 430 may be filled with electrical conductor materials and a dielectric material to create a pillar 425, which may be coupled (e.g., selectively, such as using the pillar selector 445) to a pillar row line 420. In other words, memory cells 410 in a memory cell stack 435 may share a common electrode (e.g., a pillar 425). Thus, each memory cell 410 may be coupled with a word line plate 415 and a pillar 425. In some cases, each pillar 425 (e.g., within each via 430) may be coupled with a first word line finger via corresponding first memory cells and a second word line finger via corresponding second memory cells, as described in further detail with reference to FIG. 4. Trench insulating layers 406 may be electrically insulating and may provide insulation between alternating (e.g., interdigited) word line fingers of each word line plate 415 (e.g., word line fingers on each side of a via 430 in the direction of the pillar column lines 420, where word line fingers on opposite sides of a trench insulating layer 406 may extend in parallel but opposite directions away from the spines of their respective word line plates, such as with a first word line finger immediately on one side of the trench insulating layer 406 extending to the right and a second word line finger immediately on the opposite side of the trench insulating layer 406 extending to the left).

In some examples, a material of the memory cells 410 (e.g., memory elements) may include a chalcogenide material as described herein. The chalcogenide material may include sulfur, germanium, and at least one Group III element (e.g., at least one of boron, aluminum, gallium, indium, and thallium). The chalcogenide material may further include selenium. In some cases, the chalcogenide material may further include arsenic, oxygen (O), silicon (Si), or any combination thereof. In some cases, a memory cell 410 which includes a chalcogenide material as described herein may have a reduced leakage current (e.g., compared with a memory cell which does not include such a chalcogenide material), may support a reduced thickness of the memory cell 410, or both. Further, the memory cell 410 may have an increased threshold voltage window, a reduced drift rate, or both. Accordingly, the memory array 400 may support a reduced power consumption, an increased threshold voltage window, a reduced drift rate, or a combination thereof.

In some examples, such as for thresholding memory cells or self-selecting memory cells 410, some or all of a set of logic states supported by the memory cells 410 may be associated with a same state, such as an amorphous state of the chalcogenide material as opposed to a crystalline state of the chalcogenide material (e.g., the material may be operable to store different or multiple logic states while remaining in an amorphous state). In some such examples, a memory cell 410 may be an example of a self-selecting memory cell 410. In such examples, the material used in the memory cell 410 may be a chalcogenide material as described herein and may be operated so as to undergo a state change during normal operation of the memory cell (e.g., due to ion migration or segregation within the memory cell 410). For example, a self-selecting memory cell 410 may have a high threshold voltage state and a low threshold voltage state. A high threshold voltage state may correspond to a first logic state (e.g., a reset state) and a first polarity of write voltage and a low threshold voltage state may correspond to a second logic state (e.g., a set state) and a second polarity of write voltage. In some examples, a memory cell 410 may alterative be switched between an amorphous and crystalline state during operation, which the amorphous and crystalline states corresponding to different resistances or threshold voltages and thus to different logic states, and such operation may in some cases be referred to as phase change operation.

In some cases, during a programming (write) operation of a self-selecting memory cell 410, a polarity of one or more pulses used for a write operation may influence (determine, set, program) a particular behavior or characteristic of the material of the memory cell 410, such as the threshold voltage of the material. The difference in threshold voltages of the material of the memory cell 410 depending on the logic state stored by the material of the memory cell 410 (e.g., the difference between the threshold voltage when the material is storing a logic state '0' versus a logic state '1') may correspond to a read window of the memory cell 410.

Various techniques may be used to form materials or components on a substrate 440. These may include, for example, chemical vapor deposition (CVD), metal-organic vapor deposition (MOCVD), physical vapor deposition (PVD), sputter deposition, atomic layer deposition (ALD), or molecular beam epitaxy (MBE), among other thin film growth techniques. Material may be removed using a variety of techniques, which may include, for example, chemical etching (also referred to as "wet etching"), plasma etching (also referred to as "dry etching"), or chemical-mechanical planarization.

As described herein, regions separating memory cells 410, for example, insulating layers 405, trench insulating layers 406, or both, may include one or more interfaces. In some examples, the interfaces of the insulating layers 405 separate memory cells 410 stacked in the vertical direction. In other words, memory cells 410 may be stacked one on top of the other and separated from one another by the interfaces. In some examples, the interfaces of the trench insulating layers 406 separate word line fingers from one another in a horizontal direction.

Figure 5A:
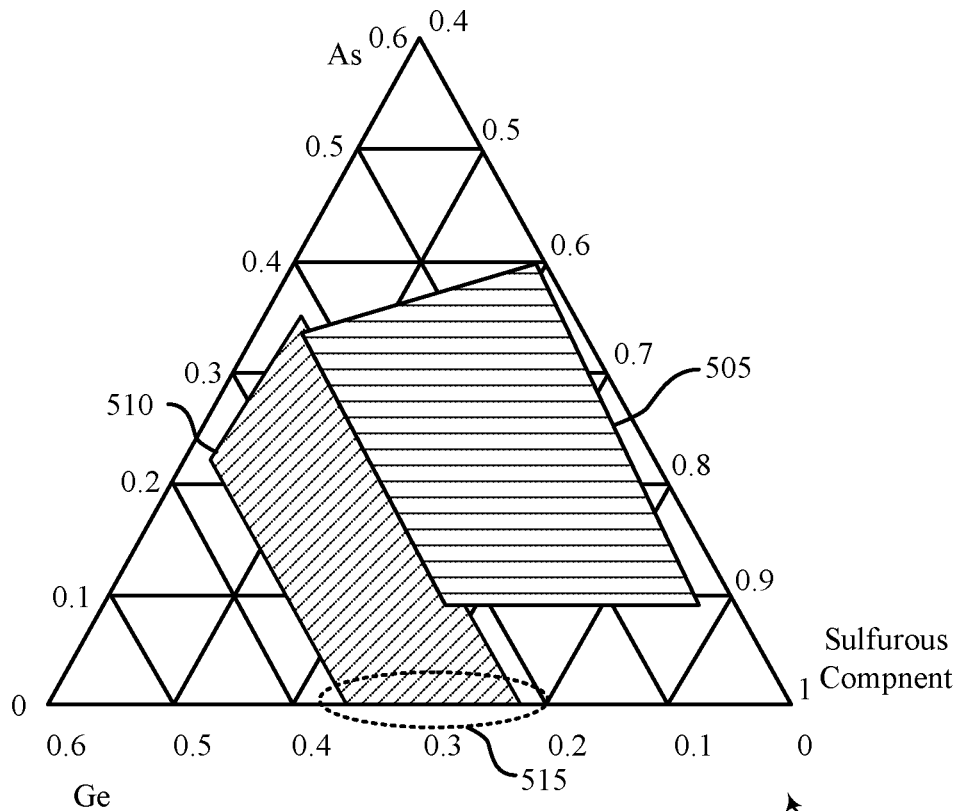
FIGS. 5A and 5B illustrate examples of plots of characteristics of chalcogenide material that support chalcogenide memory device compositions in accordance with examples as disclosed herein.

FIG. 5A illustrates an example of a plot 500-a of characteristics of chalcogenide materials in accordance with examples as disclosed herein. Although plot 500-a represents aspects of a ternary germanium-arsenic-sulfurous component plan, it is to be understood that compositions corresponding to plot 500-a may additionally include a Group III element (at least one element selected from a group consisting of boron, aluminum, gallium, indium, and thallium). A sulfurous component as described herein may be purely sulfur or may be combination of sulfur and one or more other elements. For example, a sulfurous component may comprise sulfur and selenium, a sulfurous component may comprise sulfur and oxygen, or a sulfurous component may comprise sulfur, selenium, and oxygen.

For example, region 505 illustrates compositions that include a sulfurous component and germanium (and potentially also arsenic), and which in some cases may be doped with a Group III element. Region 510 illustrates additional compositions that include a sulfurous component and germanium (and potentially also arsenic), and which in some cases also may be doped with a Group III element. In some cases, region 510 may include region 515, which may illustrate compositions that include a sulfurous component and germanium, and potentially also a Group III element, but without arsenic.

As described herein, compositions with an increased memory window and low standard deviation of the threshold voltage may be useful for storage elements, self-selecting storage elements, or other elements (e.g., components) within memory cells. Such compositions may include at least some sulfur (and hence a sulfurous component, which in some cases may additionally include selenium, potentially along with one or more other elements) along with one or more of arsenic, germanium, or at least one Group III elements. Chalcogenide material compositions as described herein may be comprised of the compositions identified in TABLE 1, which may provide composition ranges by atomic percentages (at. %) of the sulfurous component, arsenic, germanium, and a Group III element.

TABLE 1

| | Sulfurous component | As | Ge | Group III element |
|---|---|---|---|---|
| First (at. %) | ≥40 | ≤30 | 8-35 | 1-15 |
| Second (at. %) | ≥40 | ≤1 | 8-35 | 1-15 |

TABLE 1-continued

| | Sulfurous component | As | Ge | Group III element |
|---|---|---|---|---|
| Third (at. %) | ≥40 | 0 | 8-35 | 1-15 |
| Fourth (at. %) | ≥40 | ≤30 (e.g., ≤1, or 0) | 20-35 | 1-15 |

In some cases, the sulfurous component may be in an amount greater than or equal to 40 at. % of the chalcogenide material. Arsenic may be in an amount less than or equal to 30 at. % of the chalcogenide material. In some cases, the amount of arsenic may be in an amount less than or equal to 1 at. % of the chalcogenide material (or otherwise in a trace or de minimis amount).

In some examples, the composition may include no arsenic. In some examples, germanium may be in an amount ranging from 8 at. % to 35 at. % of the chalcogenide material, which in some cases may substantially correspond to region 505. In other examples, the amount of germanium may be in an amount ranging from 20 at. % to 35 at. % of the chalcogenide material, which in some cases may substantially correspond to region 510.

A Group III element may be at least one element selected from a group consisting of boron, aluminum, gallium, indium, and thallium in an amount ranging from 1 at. % to 15 at. % of the chalcogenide material (inclusive). In some cases, the at least one element selected from the group may consist of indium in an amount ranging from 1 at. % to 15 at. % of the chalcogenide material. In some cases, the at least one element selected from the group may consist of boron in an amount ranging from 1 at. % to 15 at. % of the chalcogenide material.

In some cases, the at least one element selected from the group may consist of aluminum in an amount ranging from 1 at. % to 15 at. % of the chalcogenide material. In some cases, the at least one element selected from the group may consist of gallium in an amount ranging from 1 at. % to 15 at. % of the chalcogenide material. In some cases, the at least one element selected from the group may consist of TI in an amount ranging from 1 at. % to 15 at. % of the chalcogenide material.

Chalcogenide material compositions may be comprised of the compositions identified in TABLE 2, which may provide composition ranges by atomic percentages (at. %) of the sulfurous component, arsenic, germanium, and a Group III element. For example, region 505 and region 510 may represent chalcogenide compositions identified in TABLE 2.

TABLE 2

| | Sulfurous component | As | Ge | Group III element |
|---|---|---|---|---|
| First (at. %) | ≥40 | ≤40 | 8-35 | 1-15 |
| Second (at. %) | ≥40 | ≤40 (e.g., ≤30, ≤1, or 0) | 8-35 | 1-15 |

In some cases, the sulfurous component may be in an amount greater than or equal to 40 at. % of the chalcogenide material. Arsenic may be in an amount less than or equal to 40 at. % of the chalcogenide material. In some cases, arsenic may be in an amount less than or equal to 30 at. % of the chalcogenide material, arsenic may be an in amount less than or equal to 1 at. % of the chalcogenide material, or there may be no amount of arsenic in the chalcogenide material. In some examples, germanium may be in an amount ranging from 8 at. % to 35 at. % of the chalcogenide material. In some cases, the presence of germanium may affect the threshold voltage drift. A Group III element may be at least one element selected from a group consisting of boron, aluminum, gallium, indium, and thallium and may be included in the composition in an amount ranging from 1 at. % to 15 at. % of the composition.

Chalcogenide material compositions may be comprised of the compositions identified in TABLE 3, which may provide composition ranges by atomic percentages (at. %) of the sulfurous component, arsenic, germanium, and a Group III element. For example, region 510 may represent chalcogenide compositions identified in TABLE 3.

TABLE 3

| | Sulfurous component | As | Ge | Group III element |
|---|---|---|---|---|
| First (at. %) | ≥40 | ≤30 | 20-35 | 1-15 |
| Second (at. %) | ≥40 | ≤40 (e.g., ≤30, ≤1, or 0) | 20-35 | 1-15 |

In some cases, the sulfurous component may be in an amount greater than or equal to 40 at. % of the chalcogenide material. Arsenic may be in an amount less than or equal to 30 at. % of the chalcogenide material. In some cases, arsenic may be in an amount less than or equal to 40 at. % of the chalcogenide material, arsenic may be an in amount less than or equal to 1 at. % of the chalcogenide material, or there may be no amount of arsenic in the chalcogenide material. In some examples, germanium may be in an amount ranging from 20 at. % to 35 at. % of the chalcogenide material. A Group III element may be at least one element selected from a group consisting of boron, aluminum, gallium, indium, and thallium and may be included in the composition in an amount ranging from 1 at. % to 15 at. % of the chalcogenide material.

In some cases, there may be no arsenic (or only trace or other de minimis amounts) in the chalcogenide material. In such cases, arsenic may be completely or nearly completely excluded from the composition of matter. For example, region 515 may represent chalcogenide compositions without arsenic. Excluding arsenic from the chalcogenide material composition may provide value to the memory device regarding safety costs (e.g., in-line handling control, selector device manufacturer availability, and environmental impact). In some cases, the absence of arsenic in the chalcogenide material may decrease the complexity of the composition, thereby simplifying the chemical deposition process. Compositions that may include the sulfurous component and germanium, potentially along with a Group III element, but no arsenic may also enhance the integration of the chalcogenide material composition in cross point technology developments (e.g., three-dimensional cross point architectures, ReRAM, DRAM, RAM, or the like), thereby enabling ALD deposition. In some cases, that a chalcogenide material composition excludes arsenic may be detected using transmission electron microscopy (TEM), electron dispersion x-ray spectroscopy (EDX), or both.

Figure 5B:
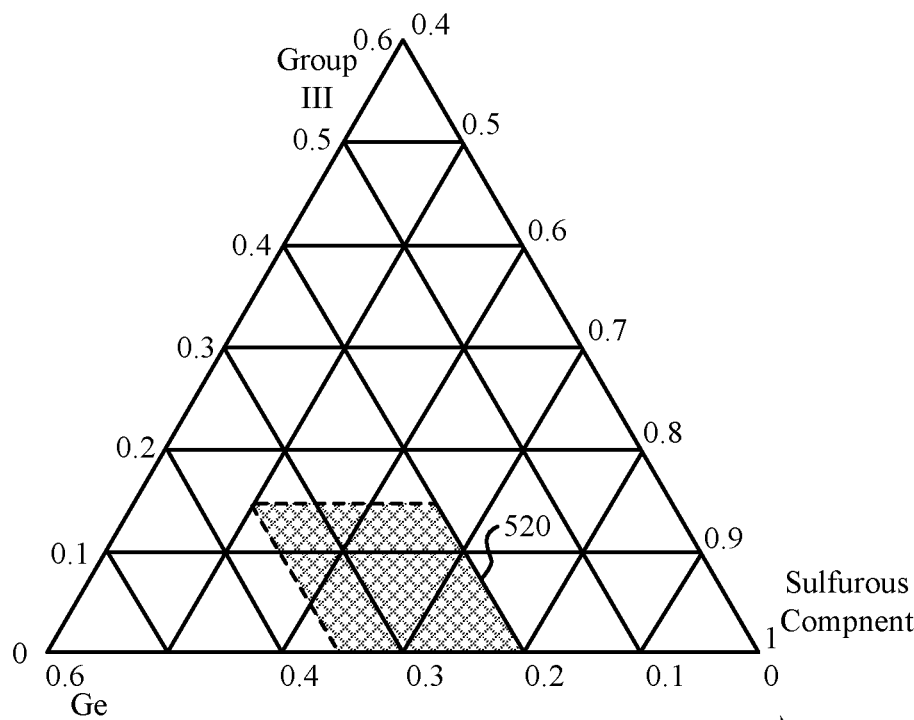

FIG. 5B illustrates a plot 500-*b* of characteristics of chalcogenide materials in accordance with examples as disclosed herein. For example, plot 500-*b* illustrates compositions of the sulfurous component and germanium, and which in some cases also may be doped with a Group III element (e.g., indium). The plot 500-*b*, including region 520, illustrates compositions that include chalcogenide materials without arsenic (e.g., arsenic-free compositions) and may, for example, correspond to compositions included in plot 500-*a* along the sulfurous component-germanium tie line (e.g., including region 515).

As described herein, a Group III element may be incorporated into a composition of matter, such as a composition of the sulfurous component and germanium to provide various benefits. In some cases, a Group III element may be incorporated into a composition of matter containing the sulfurous component and germanium. For example, the memory window may increase as the amount of the Group III element and germanium increases within the composition of matter. On the other hand, the memory window may decrease as the amount of the Group III element and germanium increases within the composition of matter. In some cases, an increase in the memory window may increase the memory elements' thickness scalability.

In some examples, arsenic may be excluded from the chalcogenide composition. For example, region 520 may represent compositions without arsenic. In such cases, the absence of arsenic may not affect the memory window. For example, a composition as depicted by region 520 with no arsenic (or little arsenic) may have a memory window that is little changed relative to a composition that includes arsenic (e.g., a memory window that is identical to a composition that includes arsenic, substantially identical to a composition that includes arsenic, or at least operationally viable for a memory device). However, the exclusion of arsenic may have various benefits as discussed elsewhere herein.

In some examples, the sulfurous component may be entirely sulfur or may be a combination of sulfur and one or more other elements, such as a combination of sulfur and selenium, a combination of sulfur and oxygen, or a combination of sulfur, selenium, and oxygen. For example, at least a portion of the selenium of a SAG composition or a III-SAG composition may be replaced with sulfur. That is, the relative ratios of the non-sulfurous components, such as arsenic, germanium, and one or more Group III elements may be as described above, while the sulfurous component may be sulfur or a mixture of sulfur and one or more other elements (e.g., sulfur and selenium).

Substituting sulfur in place of at least some selenium may affect various chemical or electrical properties of the chalcogenide material. For example, the bonding energy of sulfur between the non-sulfurous components of the chalcogenide material may be higher than the bonding energy of selenium between the non-sulfurous components (e.g., the sulfur-arsenic bonding energy may be 379 kilo joules per mole (kJ/mol), while the selenium-arsenic bonding energy may be 96 kJ/mol). Accordingly, a chalcogenide composition in which sulfur is substituted for at least some selenium may exhibit stronger bonding between the sulfurous and non-sulfurous components. However, the volatility of sulfur (e.g., pure or substantially pure sulfur) may be higher than the volatility of selenium (e.g., pure or substantially pure selenium).

Additionally, the energy of the bandgap of a chalcogenide composition including a sulfurous component may be advantageously higher than the energy of the bandgap of a chalcogenide composition which does not include the sulfurous component. For example, because the energy of the bandgap of a chalcogenide composition including a sulfurous composition is higher, the associated conductivity may be higher, which may advantageously reduce leakage current. Accordingly, a memory element (and hence a memory cell that includes the memory element) comprising the chalcogenide using a sulfurous component may be thinner (e.g., in a direction corresponding to the direction of a voltage applied across the memory cell) compared to a memory element comprising a chalcogenide without a sulfurous component while still maintaining an acceptable leakage current.

Accordingly, replacing at least some selenium with sulfur may reduce the leakage current of the chalcogenide material. For example, configuring the sulfurous component to include at least 25 at. % sulfur (e.g., no more than 75 at. % selenium or other non-selenium elements) may allow for useful leakage reduction. Hence, in some examples, the amount of sulfur included in the sulfurous component may be greater than or equal to at least one-third (⅓) the amount of selenium included in the sulfurous component (e.g., the amount of selenium included in the sulfurous component may be less than or equal to three times (3×) the amount of sulfur included in the sulfurous component). Additionally or alternatively, in some examples, the sulfurous component may be at least 40 at. % of the chalcogenide composition, hence the sulfurous component include at least 25 at. % sulfur may correspond to sulfur being at least 10 at. % of the chalcogenide composition.

Additionally, adjusting the thickness of a memory element comprising the chalcogenide material may affect the threshold voltage of the memory cell. For example, the introduction of sulfur into a chalcogenide material within a memory cell may increase the threshold voltage for the memory cell. However, because the introduction of sulfur may allow the thickness of the memory cell to be reduced while maintaining an allowable leakage current, and reducing the thickness of the memory cell may reduce the threshold voltage, a memory cell that includes a chalcogenide material as described herein may be beneficially made thinner and while maintaining a desired leakage current and voltage threshold characteristics. Thus, substituting selenium with sulfur may reduce leakage current, may allow for memory cell with reduced thickness while maintaining a fixed a threshold voltage, or any combination thereof.

In some cases, substituting at least some selenium with sulfur in a chalcogenide material may further affect a difference between threshold voltages corresponding different logic states (e.g., a threshold voltage window, which may alternatively be referred to as a read window or read window budget) of a memory cell which includes the chalcogenide material. For example, the threshold voltage window of a memory cell may be influenced by the atomic bond strength of the components of the chalcogenide material of the memory cell. Specifically, a chalcogenide material which includes more ionic components may enlarge the threshold voltage window (e.g., increase the difference of threshold voltages corresponding to different logic states). In some examples, substituting at least some selenium with sulfur may increase the ionic bond component of the chalcogenide material, and thus may enlarge the threshold voltage window. Accordingly, relative to other chalcogenide materials, the amount of a Group-III element, which may enlarge the threshold voltage window but may increase current leakage, may be reduced or the Group-III element may be removed (e.g., because the increase in the threshold voltage window due to the sulfur may compensate for the decrease in the threshold voltage window that would other occur due to the reduction in amount or removal of the Group-III element) for a chalcogenide material as described herein, which may reduce leakage current.

In some cases, substituting at least some selenium with sulfur in a chalcogenide material may further affect the drift of the threshold voltage over time (e.g., the drift rate) of a memory cell which includes the chalcogenide material. For example, the drift rate for a chalcogenide material which includes selenium may be lower than the drift rate for a chalcogenide material which includes tellurium (Te), which is due to the stronger bonding of selenium relative to tellurium (e.g., due to selenium being higher in the periodic table than tellurium). Thus, because sulfur may exhibit even stronger bonding relative to selenium (e.g., due to sulfur being higher in the periodic table than selenium), the drift rate of a chalcogenide material which includes at some sulfur may accordingly be lower than the drift rate for the chalcogenide material which includes no sulfur. Further, by extension, a chalcogenide material which includes at least some oxygen may exhibit an even further reduced drift rate. Thus, the sulfurous component may, in some cases, included at least some oxygen along with sulfur, potentially also along with selenium. Accordingly, a memory cell which includes a chalcogenide material having a sulfurous component may allow for a lower operating bias, which may reduce power consumption.

A composition of matter is described. The following provides an overview of aspects of the composition of matter as described herein:

Aspect 1: A composition of matter, including: a component comprising sulfur (e.g., a sulfurous component), where the component comprising sulfur is in an amount greater than or equal to 40 at. % of the composition. In some examples, the composition of matter may include germanium in an amount ranging from 8 at. % to 35 at. % of the composition. In some examples the composition of matter may include at least one element selected from a group consisting of boron, aluminum, gallium, indium, and thallium in an amount ranging from 1 at. % to 15 at. % of the composition.

Aspect 2: The composition of aspect 1, where the component comprising sulfur further includes selenium.

Aspect 3: The composition of any of aspects 1 through 2, where the composition includes the sulfur in a first amount and the selenium in a second amount, the first amount greater than or equal to one-third of the second amount.

Aspect 4: The composition of any of aspects 1, where the composition includes no selenium.

Aspect 5: The composition of any of aspects 1 through 4, where the composition includes the sulfur in an amount greater than or equal to 10% of the composition.

Aspect 6: The composition of any of aspects 1 through 5, where the component comprising sulfur further includes oxygen.

Aspect 7: The composition of any of aspects 1 through 6, where the composition includes arsenic in an amount less than or equal to 30 at. % of the composition.

Aspect 8: The composition of any of aspects 1 through 7, where the germanium is in an amount ranging from 20 at. % to 35 at. % of the composition.

Aspect 9: The composition of any of aspects 1 through 8, where the at least one element selected from the group comprises indium in an amount ranging from 1 at. % to 15 at. % of the composition.

Aspect 10: The composition of any of aspects 1 through 8, where the at least one element selected from the group comprises boron in an amount ranging from 1 at. % to 15 at. % of the composition.

Aspect 11: The composition of any of aspects 1 through 8, where the at least one element selected from the group comprises aluminum in an amount ranging from 1 at. % to 15 at. % of the composition.

Aspect 12: The composition of any of aspects 1 through 8, where the at least one element selected from the group comprises gallium in an amount ranging from 1 at. % to 15 at. % of the composition.

Aspect 13: The composition of any of aspects 1 through 8, where the at least one element selected from the group comprises thallium in an amount ranging from 1 at. % to 15 at. % of the composition.

An apparatus is described. The following provides an overview of aspects of the apparatus as described herein:

Aspect 14: An apparatus, including: a memory cell including a chalcogenide material, the chalcogenide material including: a component comprising sulfur, where the component comprising sulfur is in an amount greater than or equal to 40 at. % of the chalcogenide material; germanium in an amount ranging from 8 at. % to 35 at. % of the chalcogenide material; and at least one element selected from a group consisting of boron, aluminum, gallium, indium, and thallium in an amount ranging from 1 at. % to 15 at. % of the chalcogenide material.

Aspect 15: The apparatus of aspect 14, where the component comprising sulfur further includes selenium.

Aspect 16: The apparatus of any of aspects 14 through 15, where the chalcogenide material includes no selenium.

Aspect 17: The apparatus of any of aspects 14 through 16, where the chalcogenide material includes the sulfur in an amount greater than or equal to 10% of the composition.

Aspect 18: The apparatus of any of aspects 14 through 17, where the component comprising sulfur further includes oxygen.

Aspect 19: The apparatus of any of aspects 14 through 18, where the memory cell comprises a storage element operable to store a logic value, the storage element comprising the chalcogenide material.

Aspect 20: The apparatus of aspect 19, where the storage element is a self-selecting storage element.

Aspect 21: The apparatus of any of aspects 19 through 20, where the storage element is operable to store a first logic value based at least in part on a voltage of a first polarity being applied across the chalcogenide material and a second logic value based at least in part on a voltage of a second polarity being applied across the chalcogenide material.

An apparatus is described. The following provides an overview of aspects of the apparatus as described herein:

Aspect 22: A apparatus, including: a first access line; a second access line; and a memory cell that includes a chalcogenide material comprising sulfur, germanium, and at least one of boron, aluminum, gallium, indium, or thallium, where the first access line is in electronic communication with the second access line via the memory cell.

Aspect 23: The apparatus of aspect 22, where: within the chalcogenide material, a component comprising the sulfur comprises greater than or equal to 40 at. % of the chalcogenide material; the germanium is in an amount ranging from 8 at. % to 35 at. % of the chalcogenide material; and the at least one of boron, aluminum, gallium, indium, or thallium is in an amount ranging from 1 at. % to 15 at. % of the chalcogenide material.

Aspect 24: The apparatus of aspect 23, where the component comprising the sulfur further includes selenium, oxygen, or both.

Aspect 25: The apparatus of any of aspects 22 through 24, where the memory cell comprises a storage element operable to store a logic value, the storage element comprising the chalcogenide material.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three-dimensional structure where two dimensions are greater than a third, e.g., a thin-film. Layers or levels may include different elements, components, and/or materials. In some examples, one layer or level may be composed of two or more sublayers or sublevels.

As used herein, the term "substantially" means that the modified characteristic (e.g., a verb or adjective modified by the term substantially) need not be absolute but is close enough to achieve the advantages of the characteristic.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of a memory array.

The devices discussed herein, including a memory array, may be formed on a semiconductor substrate, such as selenium, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A composition of matter, comprising:
   a component comprising sulfur, wherein the component comprising sulfur is in an amount greater than or equal to 40 atomic percent (at. %) of the composition;
   germanium in an amount ranging from 8 at. % to 35 at. % of the composition; and
   at least one element selected from a group consisting of boron, aluminum, gallium, indium, and thallium in an amount ranging from 1 at. % to 15 at. % of the composition.

2. The composition of claim 1, wherein the component comprising sulfur further comprises selenium.

3. The composition of claim 2, wherein the composition comprises the sulfur in a first amount and the selenium in a second amount, the first amount greater than or equal to one-third of the second amount.

4. The composition of claim 1, wherein the composition includes no selenium.

5. The composition of claim 1, wherein the composition comprises the sulfur in an amount greater than or equal to 10% of the composition.

6. The composition of claim 1, wherein the component comprising sulfur further comprises oxygen.

7. The composition of claim 1, further comprising:
arsenic in an amount less than or equal to 30 at. % of the composition.

8. The composition of claim 1, wherein the germanium is in an amount ranging from 20 at. % to 35 at. % of the composition.

9. The composition of claim 1, wherein the at least one element selected from the group comprises indium in an amount ranging from 1 at. % to 15 at. % of the composition.

10. The composition of claim 1, wherein the at least one element selected from the group comprises boron in an amount ranging from 1 at. % to 15 at. % of the composition.

11. The composition of claim 1, wherein the at least one element selected from the group comprises aluminum in an amount ranging from 1 at. % to 15 at. % of the composition.

12. The composition of claim 1, wherein the at least one element selected from the group comprises gallium in an amount ranging from 1 at. % to 15 at. % of the composition.

13. The composition of claim 1, wherein the at least one element selected from the group comprises thallium in an amount ranging from 1 at. % to 15 at. % of the composition.

14. An apparatus, comprising:
a memory cell comprising a chalcogenide material, the chalcogenide material comprising:
a component comprising sulfur, wherein the component comprising sulfur is in an amount greater than or equal to 40 atomic percent (at. %) of the chalcogenide material;
germanium in an amount ranging from 8 at. % to 35 at. % of the chalcogenide material; and
at least one element selected from a group consisting of boron, aluminum, gallium, indium, and thallium in an amount ranging from 1 at. % to 15 at. % of the chalcogenide material.

15. The apparatus of claim 14, wherein the component comprising sulfur further comprises selenium.

16. The apparatus of claim 14, wherein the chalcogenide material includes no selenium.

17. The apparatus of claim 14, wherein the chalcogenide material comprises the sulfur in an amount greater than or equal to 10% of the chalcogenide material.

18. The apparatus of claim 14, wherein the component comprising sulfur further comprises oxygen.

19. The apparatus of claim 14, wherein the memory cell comprises a storage element operable to store a logic value, the storage element comprising the chalcogenide material.

20. The apparatus of claim 19, wherein the storage element comprises a self-selecting storage element.

21. The apparatus of claim 19, wherein the storage element is operable to store a first logic value based at least in part on a voltage of a first polarity being applied across the chalcogenide material and a second logic value based at least in part on a voltage of a second polarity being applied across the chalcogenide material.

22. An apparatus, comprising:
a first access line;
a second access line; and
a memory cell that includes a chalcogenide material comprising sulfur, germanium, and at least one of boron, aluminum, gallium, indium, or thallium, wherein the at least one of boron, aluminum, gallium, indium, or thallium is in an amount ranging from 1 atomic percent (at. %) to 15 at. % of the chalcogenide material, and wherein the first access line is in electronic communication with the second access line via the memory cell.

23. The apparatus of claim 22, wherein:
within the chalcogenide material, a component comprising the sulfur comprises greater than or equal to 40 at. % of the chalcogenide material; and
the germanium is in an amount ranging from 8 at. % to 35 at. % of the chalcogenide material.

24. The apparatus of claim 23, wherein the component comprising the sulfur further comprises selenium, oxygen, or both.

25. The apparatus of claim 22, wherein the memory cell comprises a storage element operable to store a logic value, the storage element comprising the chalcogenide material.

* * * * *